(12) United States Patent
Oi

(10) Patent No.: US 10,784,782 B2
(45) Date of Patent: Sep. 22, 2020

(54) DRIVE DEVICE

(71) Applicant: TOYOTA JIDOSHA KABUSHIKI KAISHA, Toyota-shi, Aichi-ken (JP)

(72) Inventor: Shohei Oi, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/166,903

(22) Filed: Oct. 22, 2018

(65) Prior Publication Data

US 2019/0123652 A1 Apr. 25, 2019

(30) Foreign Application Priority Data

Oct. 23, 2017 (JP) .................. 2017-204311

(51) Int. Cl.
  *H02M 3/158* (2006.01)
  *B60L 50/61* (2019.01)
  *B60W 30/182* (2020.01)
  *H02P 23/14* (2006.01)
  *G01R 19/165* (2006.01)
  *B60L 50/51* (2019.01)
  *B60K 6/445* (2007.10)
  *B60W 20/20* (2016.01)
  *B60L 15/00* (2006.01)
  (Continued)

(52) U.S. Cl.
  CPC .......... *H02M 3/1584* (2013.01); *B60K 6/445* (2013.01); *B60L 15/007* (2013.01); *B60L 15/2045* (2013.01); *B60L 50/16* (2019.02); *B60L 50/51* (2019.02); *B60L 50/61* (2019.02); *B60W 20/20* (2013.01); *B60W 30/182* (2013.01); *G01R 19/16528* (2013.01); *H02J 7/24* (2013.01); *H02P 23/14* (2013.01); *B60L 2210/14* (2013.01); *B60L 2210/42* (2013.01); *B60L 2260/26* (2013.01); *H02K 11/0094* (2013.01)

(58) Field of Classification Search
CPC .... H02M 3/1584; B60L 50/61; B60L 2210/14
See application file for complete search history.

(56) References Cited

U.S. PATENT DOCUMENTS

| 2012/0109442 | A1 | 5/2012 | Kato et al. |
| 2014/0265563 | A1* | 9/2014 | Schrader ............. H02M 3/1584 307/18 |
| 2017/0257052 | A1* | 9/2017 | Yamamoto ............. B60K 6/445 |

FOREIGN PATENT DOCUMENTS

| EP | 2 441 632 A1 | 4/2012 |
| JP | 2010-104139 A | 5/2010 |
| JP | 2017-127104 A | 7/2017 |

* cited by examiner

*Primary Examiner* — Cortez M Cook
(74) *Attorney, Agent, or Firm* — Sughrue Mion, PLLC

(57) ABSTRACT

A drive device comprises a plurality of boost converters connected in parallel to each other and placed between a power storage device side and an electric load side; a drive mode setting switch operated to set a drive mode among a plurality of drive modes; and a control device configured to control the plurality of boost converters by employing one control mode including a first control mode that drives and controls only some boost converters out of the plurality of boost converters and a second control mode that drives and controls a larger number of boost converters than some boost converters. The control device changes a switchover reference value that is used to switch over control between the first control mode and the second control mode according to the magnitude of an electric load, based on a drive mode set by operation of the drive mode setting switch.

9 Claims, 5 Drawing Sheets

(51) Int. Cl.
*B60L 50/16* (2019.01)
*B60L 15/20* (2006.01)
*H02J 7/24* (2006.01)
*H02K 11/00* (2016.01)

DRIVE DEVICE

CROSS-REFERENCE TO RELATED APPLICATIONS

The present disclosure claims priority to Japanese Patent Application No. 2017-204311 filed Oct. 23, 2017, which is incorporated herein by reference in its entirety including specification, drawings and claims.

TECHNICAL FIELD

The present disclosure relates to a drive device and more specifically relates to a drive device including a plurality of boost converters that are connected in parallel to each other and that are configured to transmit electric power with conversion of a voltage between a power storage device side and an electric load side.

BACKGROUND

A proposed configuration of a drive device mounted on a vehicle includes two boost converters that are connected in parallel to each other and that are placed between a battery and a motor for driving (as described in, for example, JP 2010-104139A). This device uses the two boost converters with switching over the drive mode between a mode in which only one boost converter is driven and a mode in which two boost converters are driven.

SUMMARY

The drive device described above generally controls the two boost converters such that only one of the two boost converters is driven in the case of a small output of the motor and that both the two boost converters are driven with an increase in output of the motor. Driving only one of the two boost converters provides the smaller switching loss, compared with driving both the two boost converters. In terms of improving the energy efficiency, one possible configuration drives only one boost converter as long as possible and additionally drives the other boost converter when driving only one boost converter fails to meet an increase in output. This configuration may, however, fail to sufficiently follow up an increase in output and cause an insufficiency of power supply required for the motor, according to the response in a shift from driving only one of the boost converters to driving both the two boost converters. Another possible configuration additionally drives the other boost converter even when driving only one of the boost converters sufficiently meets a required output, with a view to following up a possible increase in output of the motor. This configuration, however, drives both the two boost converters more than necessary and thereby increases the switching loss.

The drive device described above may be configured to employ various drive modes, for example, a drive mode that gives priority to the energy efficiency and a drive mode that gives priority to the response, and allow an operator to select a drive mode. This configuration, however, does not take into account the operations of the two boost converters in the respective drive modes.

A drive device of the present disclosure mainly aims to achieve boost control that is suitable for a drive mode selected by an operator.

In order to achieve the above primary object, the drive device of the present disclosure employs the following configuration.

The present disclosure is directed to a drive device. The drive device includes a power storage device, an electric load, a plurality of boost converters connected in parallel to each other and configured to transmit electric power with conversion of a voltage between the power storage device side and the electric load side, a control device configured to control the plurality of boost converters by employing one control mode among a plurality of control modes including a first control mode that drives and controls only some boost converters out of the plurality of boost converters and a second control mode that drives and controls a larger number of boost converters than the some boost converters, and a drive mode setting switch operated by an operator to set a plurality of drive modes that drives the drive device. The control device changes a switchover reference value that is used to switch over control between the first control mode and the second control mode according to a magnitude of the electric load, based on a drive mode set by operation of the drive mode setting switch.

The drive device of this aspect controls the plurality of boost converters by employing one control mode among the plurality of control modes including the first control mode that drives and controls only some boost converters out of the plurality of boost converters and the second control mode that drives and controls a larger number of boost converters than some boost converters driven and controlled in the first control mode. The drive device changes the switchover reference value that is used to switch over control between the first control mode and the second control mode according to the magnitude of the electric load, based on the drive mode set by operation of the drive mode setting switch. This configuration can thus switch over the control between the first control mode and the second control mode by using the switchover reference value according to the drive mode. As a result, this configuration achieves boost control that is suitable for the drive mode selected by the operator.

DESCRIPTION OF EMBODIMENTS

Figure 1:
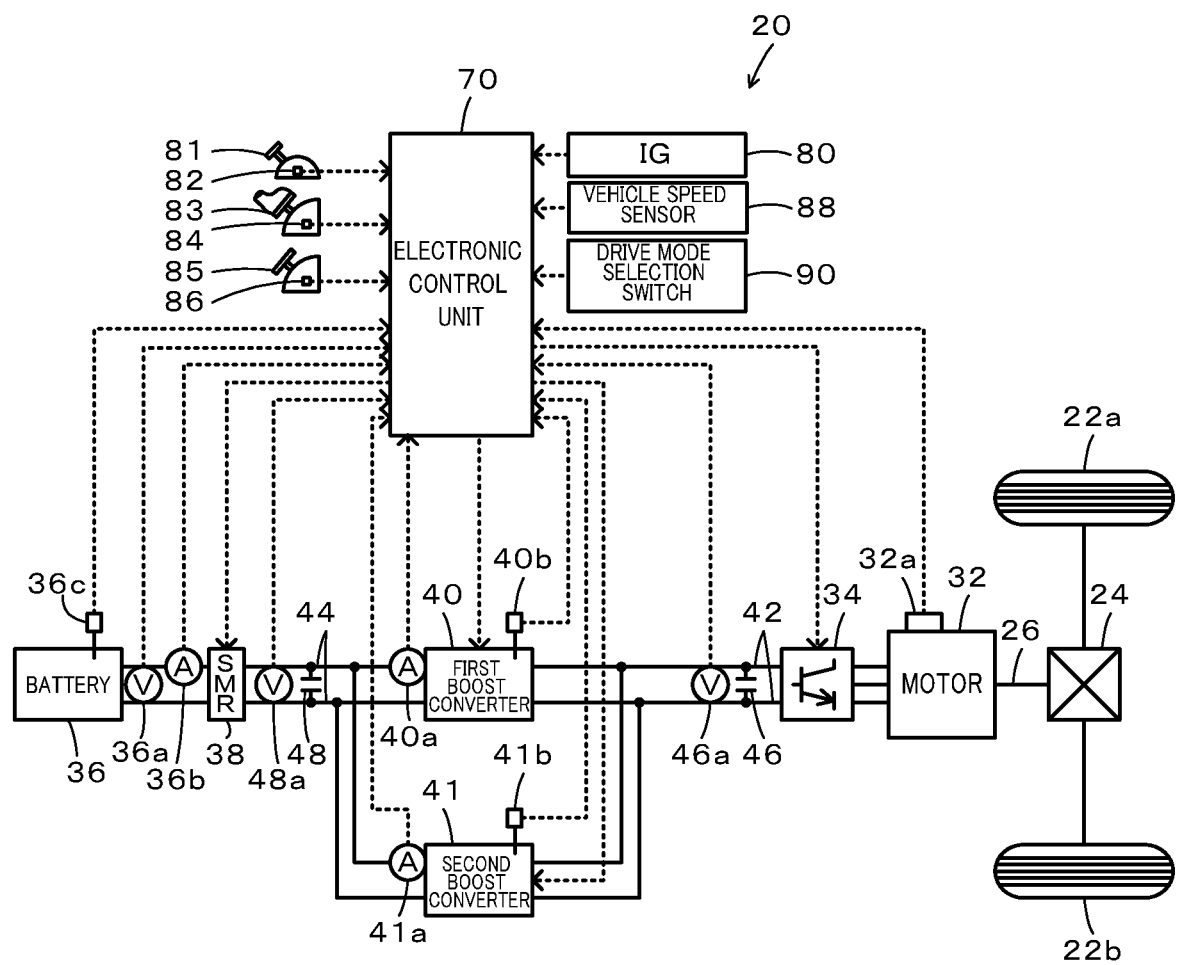
FIG. 1 is a configuration diagram illustrating the schematic configuration of an electric vehicle with a drive device according to one embodiment of the present disclosure mounted thereon.
Figure 2:
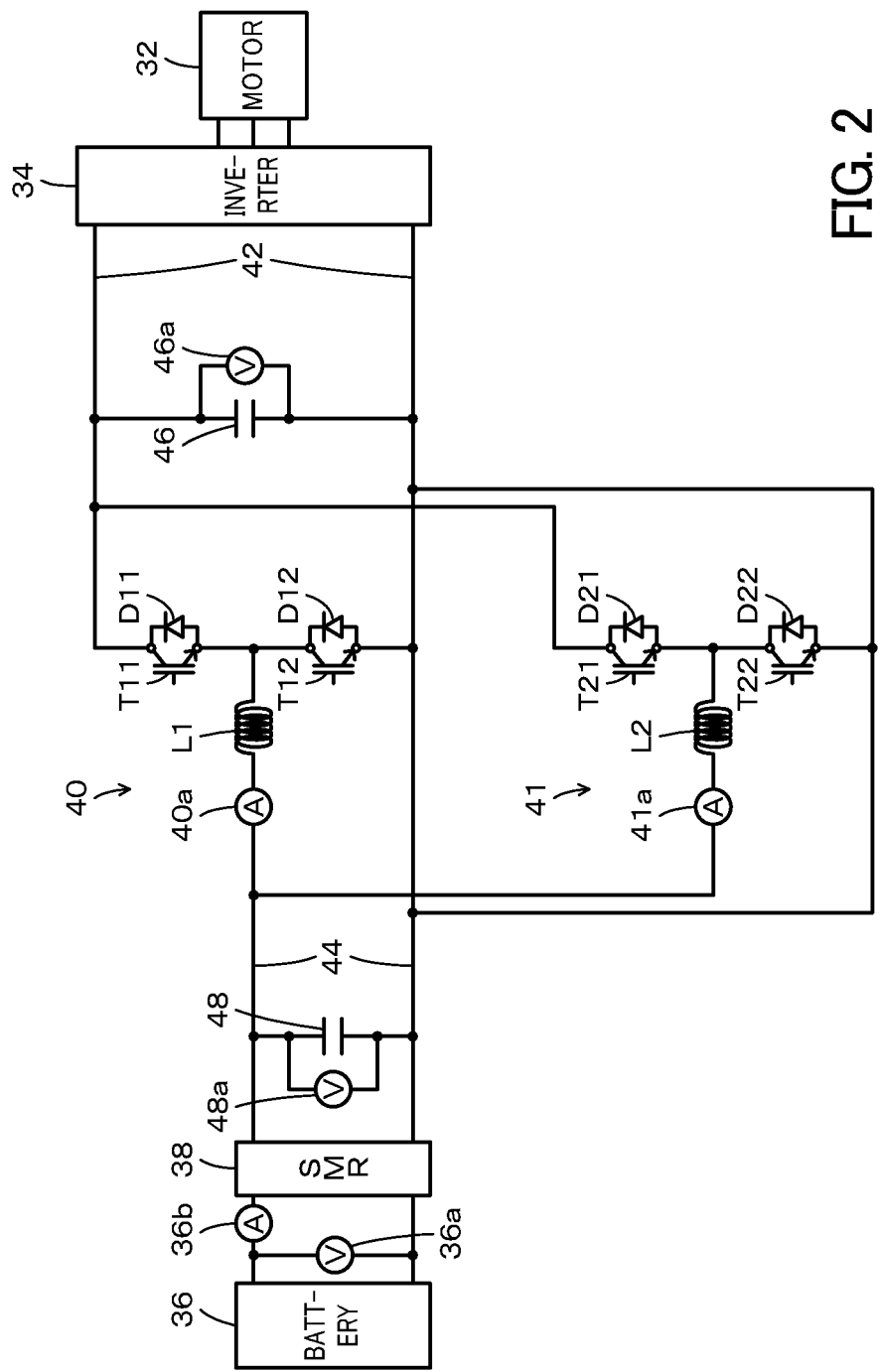
FIG. 2 is a configuration diagram illustrating the schematic configuration of an electric drive system including a motor.

The following describes some aspects of the present disclosure with referring to an embodiment. FIG. 1 is a configuration diagram illustrating the schematic configuration of an electric vehicle 20 with a drive device according to one embodiment of the present disclosure mounted thereon. FIG. 2 is a configuration diagram illustrating the schematic configuration of an electric drive system including a motor 32. As shown in FIG. 1, the electric vehicle 20 of the embodiment includes a motor 32, an inverter 34, a battery 36 as a power storage device, first and second boost converters 40 and 41, and an electronic control unit 70. The motor 32, the inverter 34, the battery 36, the first and second boost converters 40 and 41 and the electronic control unit 70 correspond to the drive device according to the embodiment.

The motor 32 is configured as, for example, a synchronous generator motor and includes a rotor connected with a driveshaft 26 that is coupled with drive wheels 22a and 22b via a differential gear 24. The inverter 34 is connected with the motor 32 and with high voltage-side power lines 42. The electronic control unit 70 performs switching control of a plurality of switching elements (not shown) included in the inverter 34, so as to rotate and drive the motor 32. A capacitor 46 for smoothing is mounted to a positive electrode line and a negative electrode line of the high voltage-side power lines 42.

The battery 36 is configured as, for example, a lithium ion rechargeable battery or a nickel metal hydride battery and is connected with low voltage-side power lines 44 as second power lines. A system main relay 38 configured to connect and disconnect the battery 36 and a capacitor 48 for smoothing are mounted in this sequence from the battery 36-side to a positive electrode line and a negative electrode line of the low voltage-side power lines 44.

As shown in FIG. 2, the first boost converter 40 is connected with the high voltage-side power lines 42 and with the low voltage-side power lines 44 and is configured as a known step-up/down converter including two transistors T11 and T12, two diodes D11 and D12 and a reactor L1. The transistor T11 is connected with the positive electrode line of the high voltage-side power lines 42. The transistor T12 is connected with the transistor T11 and with the negative electrode lines of the high voltage-side power lines 42 and of the low voltage-side power lines 44. The reactor L1 is connected with a connection point between the transistors T11 and T12 and with the positive electrode line of the low voltage-side power lines 44. The electronic control unit 70 regulates the rate of ON time of the transistors T11 and T12 of the first boost converter 40, so that the first boost converter 40 supplies the power of the low voltage-side power lines 44 to the high voltage-side power lines 42 with stepping up the voltage of the power, while supplying the power of the high voltage-side power lines 42 to the low voltage-side power lines 44 with stepping down the voltage of the power.

The second boost converter 41 is configured as a boost converter having the same performance as that of the first boost converter 40 within a manufacturing error and the like. More specifically, like the first boost converter 40, the second boost converter 41 is connected with the high voltage-side power lines 42 and with the low voltage-side power lines 44 and is configured as a known step-up/down converter including two transistors T21 and T22, two diodes D21 and D22 and a reactor L2. The electronic control unit 70 regulates the rate of ON time of the transistors T21 and T22 of the second boost converter 41, so that the second boost converter 41 supplies the power of the low voltage-side power lines 44 to the high voltage-side power lines 42 with stepping up the voltage of the power, while supplying the power of the high voltage-side power lines 42 to the low voltage-side power lines 44 with stepping down the voltage of the power.

The electronic control unit 70 is configured as a CPU-based microprocessor and includes a ROM configured to store processing programs, a RAM configured to temporarily store data, a non-volatile flash memory and input/output ports, in addition to the CPU, although not being illustrated.

As shown in FIG. 1, signals from various sensors are input into the electronic control unit 70 via the input port. The signals input into the electronic control unit 70 include, for example, a rotational position θm from a rotational position detection sensor 32a configured to detect the rotational position of the rotor of the motor 32 and phase currents Iu and Iv from current sensors configured to detect electric currents flowing in the respective phases of the motor 32. The input signals also include a voltage Vb from a voltage sensor 36a mounted between terminals of the battery 36, an electric current Ib from a current sensor 36b mounted to an output terminal of the battery 36, and a battery temperature Tb from a temperature sensor 36c mounted to the battery 36. The input signals additionally include a voltage VH of the high voltage-side power lines 42 (capacitor 46) from a voltage sensor 46a mounted between terminals of the capacitor 46 and a voltage VL of the low voltage-side power lines 44 (capacitor 48) from a voltage sensor 48a mounted between terminals of the capacitor 48. The input signals further include electric currents IL1 and IL2 of the reactors L1 and L2 from current sensors 40a and 40b configured to detect electric currents flowing in the reactors L1 and L2 of the first and the second boost converters 40 and 41 and temperatures tc1 and tc2 of the first and the second boost converters 40 and 41 from temperature sensors 40b and 41b mounted to the first and the second boost converters 40 and 41. The input signals also include an ignition signal from an ignition switch 80 and a shift position SP from a shift position sensor 82 configured to detect an operating position of a shift lever 81. The input signals further include an accelerator position Acc from an accelerator pedal position sensor 84 configured to detect a depression amount of an accelerator pedal 83, a brake pedal position BP from a brake pedal position sensor 86 configured to detect a depression amount of a brake pedal 85, and a vehicle speed V from a vehicle speed sensor 88. The input signals also include a switch control signal SW from a drive mode selection switch 90 that is switched over in response to the driver's operation. According to the embodiment, there are a plurality of drive modes, i.e., an ordinary mode that intends to achieve both an energy efficiency (fuel consumption) and a response, an eco mode that gives priority to the energy efficiency (fuel consumption) compared with the ordinary mode, and a power mode that gives priority to the response compared with the ordinary mode.

As shown in FIG. 1, various control signals are output from the electronic control unit 70 via the output port. The signals output from the electronic control unit 70 include, for example, switching control signals to the plurality of switching elements included in the inverter 34, switching control signals to the transistors T11 and T12 of the first boost converter 40, switching control signals to the transistors T21 and T22 of the second boost converter 41, and a drive control signal to the system main relay 38. The electronic control unit 70 calculates an electrical angle θe and a rotation speed Nm of the motor 32, based on the rotational position θm of the rotor of the motor 32 from the rotational position detection sensor 32a.

The electronic control unit 70 calculates a state of charge SOC of the battery 36, based on an integrated value of the electric current Ib of the battery 36 from the current sensor 36b. The electronic control unit 70 also calculates input and output limits Win and Wout that denote maximum allowable powers to be charged into and discharged from the battery 36, based on the calculated state of charge SOC and the battery temperature Tb from the temperature sensor 36c mounted to the battery 36. The state of charge SOC herein denotes a ratio of the capacity of electric power dischargeable from the battery 36 to the overall capacity of the battery 36.

In the electric vehicle 20 of the embodiment having the above configuration, the electronic control unit 70 first sets a required torque Td* that is required for driving (required for the driveshaft 26), based on the accelerator position Acc and the vehicle speed V, and multiplies the required torque Td* by a rotation speed of the driveshaft 26 to set a load power Pm which the motor 32 is required to output for driving. The electronic control unit 70 subsequently sets a torque command Tm* such that the load power Pm is output from the motor 32. The electronic control unit 70 then performs witching control of the switching elements included in the inverter 34, such as to output the torque command Tm*. The electronic control unit 70 also sets a target voltage VH* of the high voltage-side power lines 42, based on the torque command Tm*, and controls the first boost converter 40 and the second boost converter 41 to supply the load power Pm to the inverter 34 with stepping up the voltage of the power from the battery 36 to the target voltage VH*. When the load power Pm is less than a switchover reference value Pref, the first boost converter 40 and the second boost converter 41 are controlled in a first control mode to drive only one boost converter (for example, the first boost converter 40) out of the first boost converter 40 and the second boost converter 41. When the load power Pm becomes equal to or greater than the switchover reference value Pref, the first boost converter 40 and the second boost converter 41 are controlled in a second control mode to drive both the first boost converter 40 and the second boost converter 41.

Figure 3:
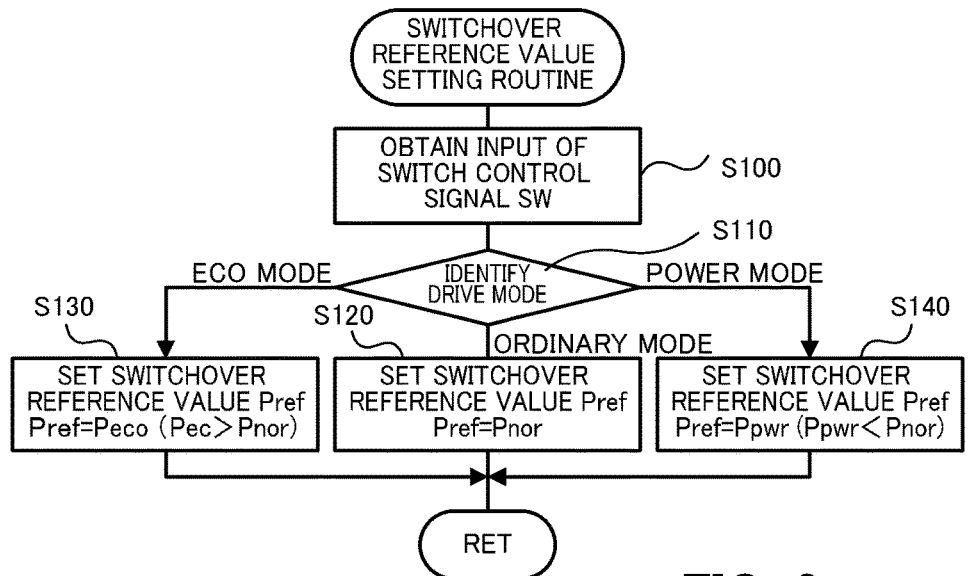
FIG. 3 is a flowchart showing one example of a switchover reference value setting routine performed by an electronic control unit according to the embodiment.

The following describes operations of the drive device mounted on the electric vehicle 20 of the embodiment having the above configuration or more specifically a series of operations to set the switchover reference value that is used to switch over the control mode of the first boost converter and the second boost converter from the first control mode to the second control mode, based on a selected drive mode. FIG. 3 is a flowchart showing one example of a switchover reference value setting routine performed by the electronic control unit 70 according to the embodiment. This routine is repeatedly performed at every predetermined time interval (for example, at every several tens msec).

When the switchover reference value setting routine is triggered, the electronic control unit 70 first obtains the input of the switch control signal SW from the drive mode selection switch 90 (step S100) and identifies the drive mode (step S110). As described above, the drive mode identified here is one of the ordinary mode, the eco mode that gives priority to the energy efficiency (fuel consumption) compared with the ordinary mode, and the power mode that gives priority to the response (power performance) compared with the ordinary mode.

Figure 4:
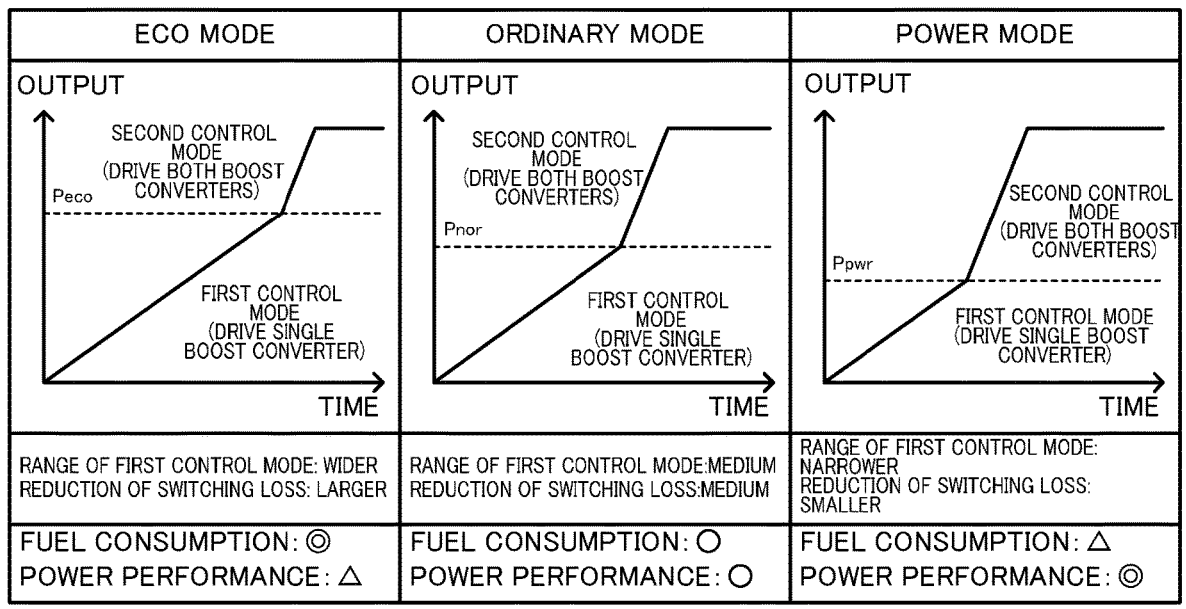
FIG. 4 is a diagram illustrating one example of variations in a switchover reference value Pref in respective drive modes.

When the drive mode is identified as the ordinary mode at step S110, the electronic control unit 70 sets a value Pnor to the switchover reference value Pref that is used to switch over the control of the first boost converter 40 and the second boost converter 41 between the first control mode and the second control mode according to the magnitude of the load power Pm (step S120) and then terminates this routine. In the first control mode, only the first boost converter 40 is driven. The less number of boost converters is driven in the first control mode, compared with that in the second control mode in which both the first boost converter 40 and the second boost converter 41 are driven. This first control mode accordingly reduces a switching loss (loss) in the first boost converter 40 and the second boost converter 41. In the second control mode, on the other hand, both the first boost converter 40 and the second boost converter 41 are driven. The larger number of boost converters are driven in the second control mode, compared with that in the first control mode in which only the first boost converter 40 is driven. This second control mode accordingly improves the response to an abrupt change in output of the motor 32. In the ordinary mode, the value Pnor that achieves both the energy efficiency (fuel consumption) and the response (power performance) is set to the switchover reference value Pref. FIG. 4 is a diagram illustrating one example of variations in the switchover reference value Pref in the respective drive modes. As shown in FIG. 4, the value Pnor used is a value that allows a switchover from the first control mode to the second control mode to be made rather quickly and that reduces the switching loss (loss) in the first boost converter 40 and the second boost converter 41 to some extent.

When the drive mode is identified as the eco mode at step S110, the electronic control unit 70 sets a value Peco that is larger than the value Pnor, to the switchover reference value Pref that is used to switch over the control between the first control mode and the second control mode (step S130) and then terminates this routine. As shown in FIG. 4, the larger value than the value Pnor is used as the value Peco. The eco mode accordingly provides a wider range of the first control mode and a smaller switching loss (loss) than those in the ordinary mode. As a result, the eco mode provides the higher energy efficiency (fuel consumption) but the slightly poorer response (power performance) than the ordinary mode.

When the drive mode is identified as the power mode at step S110, the electronic control unit 70 sets a value Ppwr that is smaller than the value Pnor, to the switchover reference value Pref that is used to switch over the control between the first control mode and the second control mode (step S140) and then terminates this routine. As shown in FIG. 4, the smaller value than the value Pnor is used as the value Ppwr. The power mode accordingly provides a narrower range of the first control mode and a larger switching loss (loss) than those in the ordinary mode. As a result, the power mode provides the better response (power performance) but the slightly lower energy efficiency (fuel consumption) than the ordinary mode.

The drive device mounted on the electric vehicle 20 of the embodiment described above identifies the drive mode, based on the switch control signal SW input from the drive mode selection switch 90 that is operated by the driver. When the drive mode is the ordinary mode, the value Pnor that allows a switchover from the first control mode to the second control mode to be made rather quickly and that reduces the switching loss (loss) in the first boost converter 40 and the second boost converter 41 to some extent is set to the switchover reference value Pref that is used to switch over the control between the first mode and the second mode. When the drive mode is the eco mode that gives priority to the energy efficiency (fuel consumption) compared with the ordinary mode, the value Peco larger than the value Pnor is set to the switchover reference value Pref. Such setting provides the higher energy efficiency (fuel consumption) but the slightly poorer response (power performance) than the ordinary mode. When the drive mode is the power mode that gives priority to the response (power performance) compared with the ordinary mode, the value Ppwr smaller than the value Pnor is set to the switchover reference value Pref. Such setting provides the better response (power performance) but the slightly lower energy efficiency (fuel consumption) than the ordinary mode. As a result, this configuration achieves the boost control (control of the first boost converter 40 and the second boost converter 41) suitable for the drive mode selected by the driver.

Figure 5:
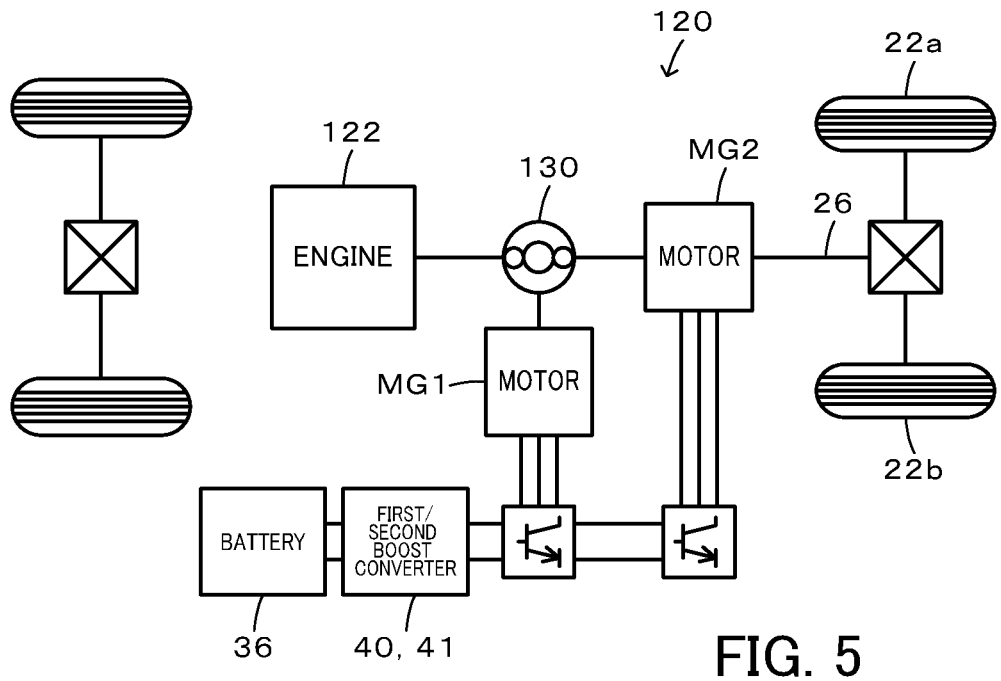
FIG. 5 is a configuration diagram illustrating the schematic configuration of a hybrid vehicle according to a modification.
Figure 6:
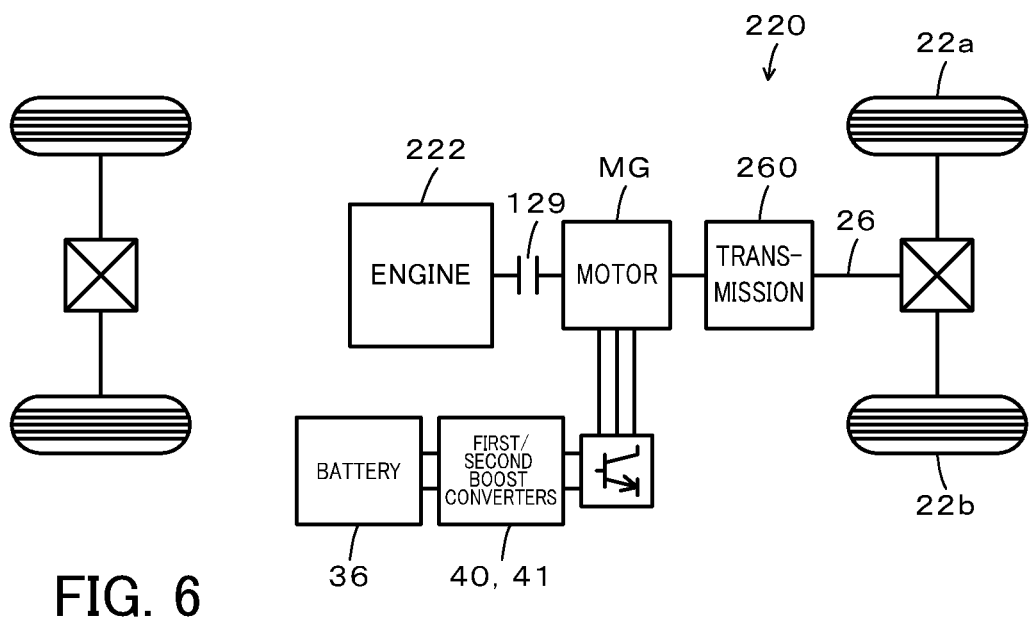
FIG. 6 is a configuration diagram illustrating the schematic configuration of a hybrid vehicle according to another modification.

The above embodiment describes the drive device mounted on the electric vehicle 20. The present disclosure may also be implemented by a drive device mounted on a hybrid vehicle 120 configured such that an engine 122, a motor MG1 and a motor MG2 are respectively connected with a carrier, a sun gear and a ring gear of a planetary gear 130 and that the ring gear of the planetary gear 130 is connected with a driveshaft 26 as shown in FIG. 5. The present disclosure may further be implemented by a drive device mounted on a hybrid vehicle 220 configured such that an engine 222 and a motor MG are connected with each other via a clutch 129 and that the engine 222 and the motor MG are connected with a driveshaft 26 via a transmission 260 as shown in FIG. 6. Additionally, the present disclosure may be implemented by a drive device mounted on a series hybrid vehicle or a drive device mounted on a fuel cell vehicle.

In the drive device mounted on a hybrid vehicle such as the hybrid vehicle 120 shown in FIG. 5 or the hybrid vehicle 220 shown in FIG. 6, possible drive modes other than the ordinary mode, the eco mode and the power mode described above may be, for example, a charge mode that drives the hybrid vehicle with charging a battery 36, a sustaining mode that drives the hybrid vehicle with maintaining the state of charge SOC of the battery 36, and a discharge mode that drives the hybrid vehicle with discharging the battery 36. The charge mode may be a mode of hybrid drive (HV drive) that causes the engine 122 or 222 to output a larger power than a required driving power that is required for driving and increases the state of charge SOC of the battery 36. The sustaining mode may be a mode of hybrid drive (HV drive) that causes the engine 122 or 222 to output the required driving power that is required for driving and maintains the state of charge SOC of the battery 36. The discharge mode may be a mode of electric drive (EV drive) that stops the operation of the engine 122 or 222 and causes the battery 36 to output the required driving power that is required for driving or may be a mode of hybrid drive (HV drive) that causes the engine 122 or 222 to output a smaller power than the required driving power that is required for driving and decreases the state of charge SOC of the battery 36.

Figure 7:
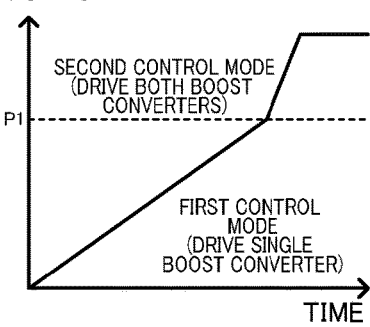
FIG. 7 is a diagram illustrating one example of variations in the switchover reference value Pref in a charge mode, a sustaining mode and a discharge mode as drive modes.

FIG. 7 is a diagram illustrating one example of variations in the switchover reference value Pref in the charge mode, the sustaining mode and the discharge mode as the drive modes. According to this modification, when the drive mode is the charge mode, in order to increase the state of charge SOC of the battery 36, priority is given to the energy efficiency (fuel consumption). A value P1 that is larger than the values in the sustaining mode and in the discharge mode is set to the switchover reference value Pref. The charge mode accordingly provides the wider range of the first control mode and the smaller switching loss (loss) than those in the sustaining mode and in the discharge mode. As a result, the charge mode provides the higher energy efficiency (fuel consumption) but the slightly poorer response (power performance) than the sustaining mode and the discharge mode. The charge mode having the slightly poorer response (power performance) provides the slightly poorer ride than the sustaining mode and the discharge mode. When the drive mode is the sustaining mode, in order to maintain the state of charge SOC of the battery 36, there is no need to give priority to the energy efficiency (fuel consumption) or to give priority to the response (power performance). A value P2 that is smaller than the value in the charge mode and that is larger than the value in the discharge mode is set to the switchover reference value Pref. The sustaining mode accordingly provides the range of the first control mode that is narrower than the range in the charge mode but is wider than the range in the discharge mode and the switching loss (loss) that is larger than the loss in the charge mode but is smaller than the loss in the discharge mode. As a result, the sustaining mode achieves both the energy efficiency (fuel consumption) and the response (power performance). The sustaining mode achieving both the energy efficiency (fuel consumption) and the response (power performance) provides the slightly better ride than the charge mode but the slightly poorer ride than the discharge mode. When the drive mode is the discharge mode, in order to provide the good response (power performance) and decrease the state of charge SOC of the battery 36, a value P3 that is smaller than the values in the charge mode and in the sustaining mode is set to the switchover reference value Pref. The discharge mode accordingly provides the narrower range of the first control mode and the larger switching loss (loss) than the charge mode and the sustaining mode. As a result, the discharge mode provides the better response (power performance) but the slightly lower energy efficiency (fuel consumption) than the charge mode and the sustaining mode. The discharge mode having the better response (power performance) provides the better ride than the charge mode and the sustaining mode. The configuration that employs the charge mode, the sustaining mode and the discharge mode as the drive modes also achieves the boost control (control of the first boost converter 40 and the second boost converter 41) suitable for the drive mode selected by the driver.

Figure 8:
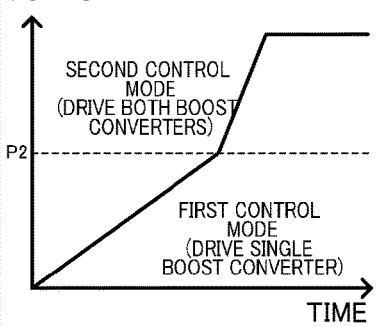
FIG. 8 is a diagram illustrating one example of variations in the switchover reference value Pref in a CD mode and a CS mode as drive modes.

In the drive device mounted on a hybrid vehicle such as the hybrid vehicle 120 shown in FIG. 5 or the hybrid vehicle 220 shown in FIG. 6, in another example, possible drive modes may be a CD (charge depleting) mode that decreases the state of charge SOC of the battery 36 and a CS (charge sustaining) mode that maintains the state of charge SOC of the battery 36 in a range about a control center SOC*. FIG. 8 is a diagram illustrating one example of variations in the switchover reference value Pref in the CD mode and in the CS mode as the drive modes. According to this modification, when the drive mode is the CD mode, in order to give priority to the response (power performance), a value Plow that is smaller than the value in the CS mode is set to the switchover reference value Pref. The CD mode accordingly provides the narrower range of the first control mode and the larger switching loss (loss) than the CS mode. As a result, the CD mode provides the better response (power performance) but the slightly lower energy efficiency (fuel consumption) than the CS mode. The CD mode having the better response (power performance) provides the better ride than the CS mode. When the drive mode is the CS mode, a value Phigh that is larger than the value in the CD mode is set to the switchover reference value Pref. The CS mode accordingly provides the wider range of the first control mode and the smaller switching loss (loss) than the CD mode. As a result, the CS mode provides the higher energy efficiency (fuel consumption) but the slightly poorer response (power performance) than the CD mode. The CS mode having the slightly poorer response (power performance) provides the slightly poorer ride than the CD mode. The configuration that employs CD mode and the CS mode as the drive modes also achieves the boost control (control of the first boost converter 40 and the second boost converter 41) suitable for the drive mode selected by the driver.

The drive device mounted on the electric vehicle 20 of the embodiment or mounted on the hybrid vehicle 120 or 220 of the modification employs the ordinary mode, the eco mode and the power mode as the drive modes or the charge mode, the sustaining mode and the discharge mode or the CD mode and the CS mode as the drive modes. Different mode other than these modes may be employed as the drive modes.

The drive device mounted on the electric vehicle 20 of the embodiment or mounted on the hybrid vehicle 120 or 220 of the modification is equipped with two boost converters, i.e., the first boost converter 40 and the second boost converter 41. The drive device may be equipped with three or more boost converters. In a configuration including three boost converters, for example, the first control mode may be a mode in which only one boost converter is driven, and the second control mode may be a mode in which two boost converters are driven. In another example, the first control mode may be a mode in which only one boost converter is driven, and the second control mode may be a mode in which three boost converters are driven. In another example, the first control mode may be a mode in which two boost converters are driven, and the second control mode may be a mode in which three boost converters are driven. In general, the first control mode may be a mode in which some boost converters are driven out of a plurality of boost converters, and the second control mode may be a mode in which a larger number of boost converters than some boost converters driven in the first control mode are driven out of the plurality of boost converters.

The drive device mounted on the electric vehicle 20 of the embodiment or mounted on the hybrid vehicle 120 or 220 of the modification is equipped with one battery 36 as the power storage device. The power storage device may be a capacitor used in place of the battery 36.

The embodiment and the modifications describe the configurations of the drive devices mounted on the electric vehicle 20 and mounted on the hybrid vehicles 120 and 220. The present disclosure may also be implemented by the configuration of a drive device mounted on a moving body other than the motor vehicle or by the configuration of a drive device built in stationary equipment such as construction equipment.

In the drive device of this aspect, the drive modes may include a predetermined mode and an efficiency priority mode that gives priority to energy efficiency compared with the predetermined mode. When the efficiency priority mode is set as the drive mode, the control device may set a larger value than a value set in the predetermined mode, to the switchover reference value. The drive device of this aspect enables the control in the first control mode that drives the less number of boost converters to be performed for a longer time period, out of the first control mode and the second control mode. Driving the less number of boost converters reduces the switching loss and thereby further improves the energy efficiency. As a result, this configuration achieves boost control that is suitable for the drive mode selected by the operator.

In the drive device of this aspect, the drive modes may include a predetermined mode and a response priority mode that gives priority to response compared with the predetermined mode. When the response priority mode is set as the drive mode, the control device may set a smaller value than a value set in the predetermined mode, to the switchover reference value. The drive device of this aspect enables the control in the second control mode that promptly follows up a variation in magnitude of the electric load to be performed for a longer time period, out of the first control mode and the second control mode. Driving the larger number of boost converters improves the followability to a variation in magnitude of the electric load and thereby gives more priority to the response. As a result, this configuration achieves boost control that is suitable for the drive mode selected by the operator.

The drive device of this aspect may further include an engine and a generator configured to generate electricity by using power from the engine. The drive modes may include a predetermined mode and a charging priority mode that gives priority to charging the power storage device compared with the predetermined mode. When the charging priority mode is set as the drive mode, the control device may set a larger value than a value set in the predetermined mode, to the switchover reference value. The drive device of this aspect enables the control in the first control mode that drives the less number of boost converters to be performed for a longer time period, out of the first control mode and the second control mode. Driving the less number of boost converters reduces the switching loss and thereby enables a greater part of electric power generated by the generator to be used to charge the power storage device. As a result, this configuration achieves boost control that is suitable for the drive mode selected by the operator.

The drive device of this aspect may further include an engine and a generator configured to generate electricity by using power from the engine. The drive modes may include a predetermined mode and a discharging priority mode that gives priority to discharging the power storage device compared with the predetermined mode. When the discharging priority mode is set as the drive mode, the control device may set a smaller value than a value set in the predetermined mode, to the switchover reference value. The drive control of this aspect enables the control in the second control mode that drives the larger number of boost converters to be performed for a longer time period, out of the first control mode and the second control mode. Driving the larger number of boost converters increases the switching loss and thereby accelerates discharging of the power storage device. As a result, this configuration achieves boost control that is suitable for the drive mode selected by the operator.

The drive device of this aspect may further include an engine and a generator configured to generate electricity by using power from the engine. The drive modes may include a predetermined mode and a sustaining priority mode that gives priority to sustaining a state of charge of the power storage device compared with the predetermined mode. When the sustaining priority mode is set as the drive mode, the control device may set a larger value than a value set in the predetermined mode, to the switchover reference value. The drive device of this aspect enables the control in the first control mode that drives the less number of boost converters to be performed for a longer time period, out of the first control mode and the second control mode. Driving the less number of boost converters reduces the switching loss, thereby suppressing discharging of the power storage device and maintaining the state of charge of the power storage device. As a result, this configuration achieves boost control that is suitable for the drive mode selected by the operator.

The following describes the correspondence relationship between the primary components of the embodiment and the primary components of the disclosure described in Summary. The battery 36 of the embodiment corresponds to the "power storage device", the inverter 34 and the motor 32 correspond to the "electric load", the first boost converter 40 corresponds to the "first boost converter", the second boost converter 41 corresponds to the "second boost converter", the electronic control unit 70 corresponds to the "control device", and the drive mode selection switch 90 corresponds to the "drive mode setting switch".

The correspondence relationship between the primary components of the embodiment and the primary components of the disclosure, regarding which the problem is described in Summary, should not be considered to limit the components of the disclosure, regarding which the problem is described in Summary, since the embodiment is only illustrative to specifically describes the aspects of the disclosure, regarding which the problem is described in Summary. In other words, the disclosure, regarding which the problem is described in Summary, should be interpreted on the basis of the description in the Summary, and the embodiment is only a specific example of the disclosure, regarding which the problem is described in Summary.

The aspect of the disclosure is described above with reference to the embodiment. The disclosure is, however, not limited to the above embodiment but various modifications and variations may be made to the embodiment without departing from the scope of the disclosure.

INDUSTRIAL APPLICABILITY

The technique of the disclosure is preferably applicable to the manufacturing industries of the drive device and so on.

The invention claimed is:

1. A drive device, comprising:
   a power storage device;
   an electric load;
   a plurality of boost converters connected in parallel to each other and configured to transmit electric power with conversion of a voltage between the power storage device side and the electric load side;
   a control device configured to control the plurality of boost converters by employing one control mode among a plurality of control modes including a first control mode that drives and controls only some boost converters out of the plurality of boost converters and a second control mode that drives and controls a larger number of boost converters than the some boost converters; and
   a drive mode setting switch operated by an operator to set a plurality of drive modes that drives the drive device, wherein
   the control device changes a switchover reference value that is used to switch over control between the first control mode and the second control mode according to a magnitude of the electric load, based on a drive mode set by operation of the drive mode setting switch.

2. The drive device according to claim 1,
   wherein the drive modes include a predetermined mode and an efficiency priority mode that gives priority to energy efficiency compared with the predetermined mode, wherein
   when the efficiency priority mode is set as the drive mode, the control device sets a larger value than a value set in the predetermined mode, to the switchover reference value.

3. The drive device according to claim 1,
   wherein the drive modes include a predetermined mode and a response priority mode that gives priority to response compared with the predetermined mode, wherein
   when the response priority mode is set as the drive mode, the control device sets a smaller value than a value set in the predetermined mode, to the switchover reference value.

4. The drive device according to claim 1, further comprising:
   an engine; and
   a generator configured to generate electricity by using power from the engine, wherein
   the drive modes include a predetermined mode and a charging priority mode that gives priority to charging the power storage device compared with the predetermined mode, wherein
   when the charging priority mode is set as the drive mode, the control device sets a larger value than a value set in the predetermined mode, to the switchover reference value.

5. The drive device according to claim 1, further comprising:
   an engine; and
   a generator configured to generate electricity by using power from the engine, wherein
   the drive modes include a predetermined mode and a discharging priority mode that gives priority to discharging the power storage device compared with the predetermined mode, wherein
   when the discharging priority mode is set as the drive mode, the control device sets a smaller value than a value set in the predetermined mode, to the switchover reference value.

6. The drive device according to claim 1, further comprising:
   an engine; and
   a generator configured to generate electricity by using power from the engine, wherein
   the drive modes include a predetermined mode and a sustaining priority mode that gives priority to sustaining a state of charge of the power storage device compared with the predetermined mode, wherein
   when the sustaining priority mode is set as the drive mode, the control device sets a larger value than a value set in the predetermined mode, to the switchover reference value.

7. The drive device according to claim 1, wherein the control device determines whether to switch from the first control mode to the second control mode based on comparison between the switchover reference value that is set according to the drive mode, and a load power supplied from the plurality of boost converters to an inverter of the drive device.

8. The drive device according to claim 1, wherein the control device sets the switchover reference value to a first reference value when the driver mode is set to a charge mode, sets the switchover reference value to a second reference value when the driver mode is set to a sustaining mode, and sets the switchover reference value to a third reference value when the driver mode is set to a discharge mode, and wherein the first reference value, the second reference value, and the third reference value are different from each other.

9. The drive device according to claim 1, wherein the control device sets the switchover reference value to a fourth reference value when the driver mode is set to a charge depleting mode in which a state of charge of a battery of the drive device decreases, and sets the switchover reference value to a fifth reference value when the driver mode is set to a charge sustaining mode in which the state of charge of the battery is maintained within a predetermined range, and
wherein the fourth reference value is different from the fifth reference value.

\* \* \* \* \*